United States Patent [19]
Suzuki et al.

[11] Patent Number: 6,154,099
[45] Date of Patent: Nov. 28, 2000

[54] RING OSCILLATOR AND METHOD OF MEASURING GATE DELAY TIME IN THIS RING OSCILLATOR

[75] Inventors: Shingo Suzuki, Sagamihara; Satoshi Nonaka, Yokohama, both of Japan

[73] Assignee: Kabushiki Kaisha Toshiba, Kawasaki, Japan

[21] Appl. No.: 09/168,292

[22] Filed: Oct. 8, 1998

[30] Foreign Application Priority Data

Oct. 9, 1997 [JP] Japan .................................. 9-277388

[51] Int. Cl.[7] ...................................................... H03B 1/00
[52] U.S. Cl. .......................... 331/57; 327/182; 327/183; 327/276; 327/278; 327/271; 327/262
[58] Field of Search .................................. 331/57, 108 R, 331/175; 327/182, 183, 278, 276, 271, 264, 262, 261

[56] References Cited

U.S. PATENT DOCUMENTS 5,434,525  7/1995  Leonowich ............................. 327/278

*Primary Examiner*—Robert Pascal
*Assistant Examiner*—Kimberly Glenn
*Attorney, Agent, or Firm*—Finnegan, Henderson, Farabow, Garrett & Dunner, L.L.P.

[57] ABSTRACT

A ring oscillator is formed by connecting three or more odd gate circuits in a ring. Each gate circuit includes a precharge dynamic gate. An output signal from the precharge dynamic gate of one gate circuit is used to precharge the precharge dynamic gates of all the remaining gate circuits. In measuring the gate delay time of the ring oscillator formed by connecting, in a ring, three or more odd gate circuits each including a precharge dynamic gate, the oscillation frequency of the ring oscillator is measured, and the reciprocal of the oscillation frequency is divided by the number of gate circuits constituting the ring oscillator.

19 Claims, 7 Drawing Sheets

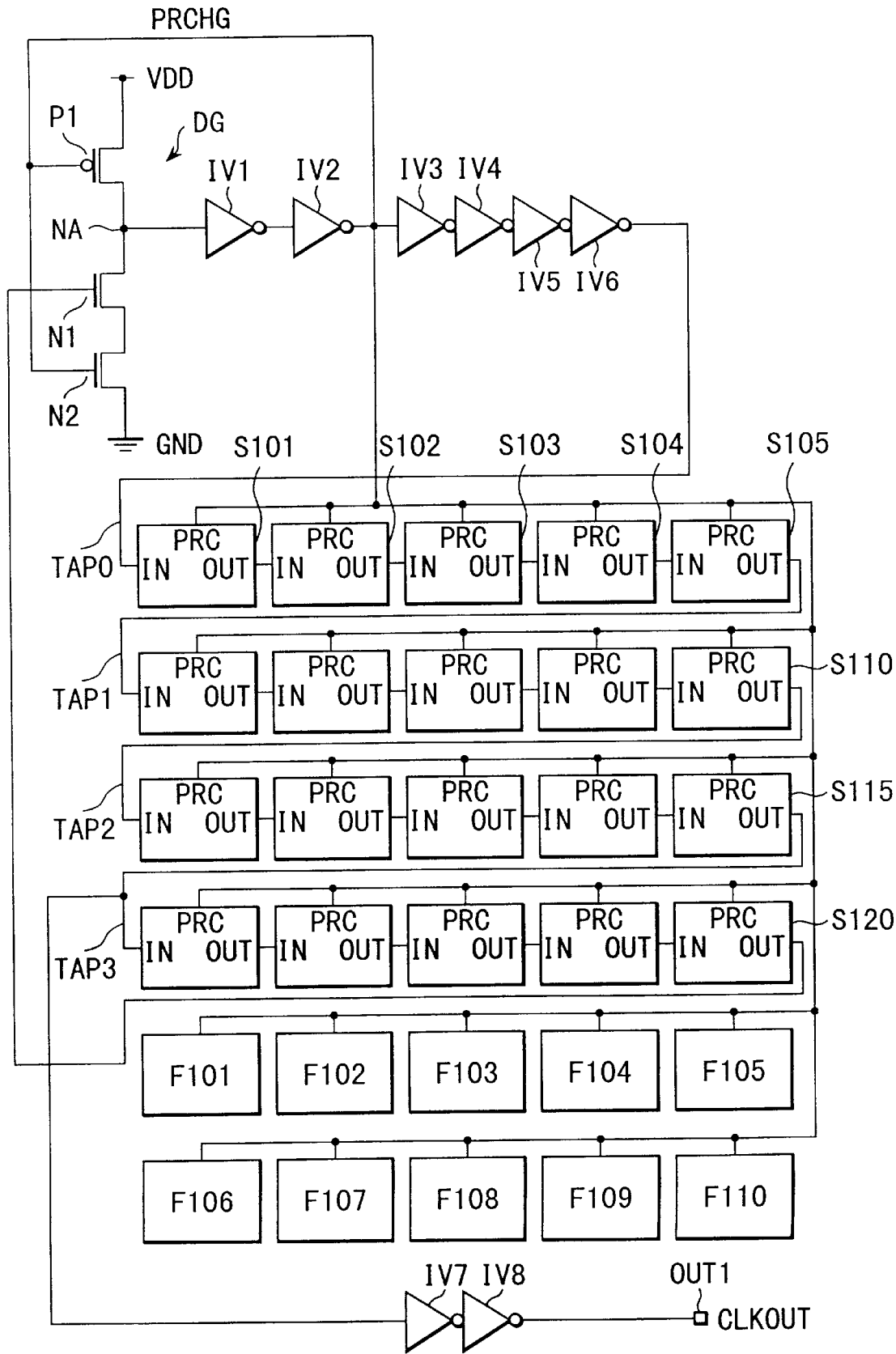
F I G. 11

RING OSCILLATOR AND METHOD OF MEASURING GATE DELAY TIME IN THIS RING OSCILLATOR

BACKGROUND OF THE INVENTION

The present invention relates to a ring oscillator incorporated in a semiconductor integrated circuit (LSI) and a method of measuring the gate delay time in this ring oscillator.

As shown in FIG. 1, a conventional ring oscillator is constituted by connecting an odd number of inverters IV101, IV102, . . . , IV123, IV124, and IV125 in a ring shape. An oscillation output is obtained from the output node of an arbitrary inverter.

As shown in FIG. 2, another conventional ring oscillator is constituted such that a NAND.gate circuit ND101 for controlling start/stop of oscillation is inserted in a ring formed by connecting a plurality (even number) of inverters IV101, IV102, . . . , IV123, and IV124.

In the ring oscillator shown in FIG. 1, letting Y be the state (signal level) at, e.g., a connection point NX, this Y is inverted to $\overline{Y}$ by the next-stage inverter IV101, and the $\overline{Y}$ is further inverted to Y by the second next-stage inverter IV102. The signal level is sequentially inverted, and becomes $\overline{Y}$ at the connection point NX through one round because an odd number of inverters are connected. Through one more round, the signal level becomes the original Y. In this manner, the ring oscillator self-oscillates.

In the ring oscillator shown in FIG. 2, the start/stop of oscillation is controlled by externally inputting an "H"- or "L"-level control signal CNT to the NAND gate circuit ND101. That is, the control signal CNT is first set at "L" level and then changed to "H" level to start oscillation. When the control signal CNT is at "L" level, an output signal from the NAND gate circuit ND101 is fixed at "H" level. Outputs from the odd-numbered inverters IV101, IV103, . . . , IV123 change to "L" level, outputs from the even-numbered inverters IV102, IV104, . . . , IV124 change to "H" level, and the initial states of the output levels of the respective inverters are determined. In this state, the ring oscillator does not oscillate. When the control signal CNT changes to "H" level, the NAND gate circuit ND101 substantially operates as an inverter, and the ring oscillator oscillates like the circuit shown in FIG. 1 in which an odd number (125) of inverters are connected in a ring shape.

However, the ring oscillator having the arrangement shown in FIG. 1 may perform high-order odd-number-fold oscillation because the output states of the inverters IV101 to IV125 are not stable immediate after the power supply is turned on. In the ring oscillator having the arrangement shown in FIG. 2, high-order odd-number-fold oscillation can be prevented unlike the circuit shown in FIG. 1 because oscillation starts after initial setting of the output levels of the inverters IV101 to IV124. However, the ring oscillator shown in FIG. 2 must be externally controlled.

The gate delay value (gate delay time) per inverter as a constituent unit has conventionally been obtained by measuring the oscillation frequency of a ring oscillator having an arrangement like the ones shown in FIGS. 1 and 2. In the ring oscillators shown in FIGS. 1 and 2, since the constituent unit is a static gate inverter, the gate delay value obtained by measuring the oscillation frequency includes only delay information of the static gate, and delay information of a dynamic gate requiring precharge cannot be obtained. In the ring oscillator shown in FIG. 1 in which an odd number of inverters are connected in a ring shape, the gate delay value is difficult to determine upon high-order odd-number-fold oscillation.

If the oscillator is constituted using a delay line instead of the ring oscillator, the gate delay per stage can be measured regardless of the static or dynamic gate. In the oscillator using the delay line, however, the gate delay value is more difficult to measure than in the ring oscillator.

BRIEF SUMMARY OF THE INVENTION

It is therefore the first object of the present invention to provide a ring oscillator capable of preventing high-order odd-number-fold oscillation without any external control.

It is the second object of the present invention to provide a gate delay time measuring method capable of easily obtaining the delay time of a dynamic gate in the ring oscillator capable of preventing high-order odd-number-fold oscillation without any external control.

The first object of the present invention can be achieved by a ring oscillator comprising at least three odd gate circuits connected in a ring shape, at least one of the gate circuits including a precharge dynamic gate.

With this arrangement, since oscillation starts after precharge (initial setting) of the precharge dynamic gate, high-order odd-number-fold oscillation can be prevented without any external control.

The first object of the present invention can be achieved by a ring oscillator comprising at least three odd gate circuits connected in a ring shape, each gate circuit including a precharge dynamic gate, wherein an output from the precharge dynamic gate in one gate circuit is used to precharge the precharge dynamic gate of another gate circuit.

With this arrangement, since oscillation starts after precharge (initial setting) of each precharge dynamic gate, high-order odd-number-fold oscillation can be prevented without any external control.

The first object of the present invention can be achieved by a ring oscillator comprising a first MOS transistor of a first conductivity type having one end of a current path connected to a first voltage supply source, a second MOS transistor of a second conductivity type having one end of a current path connected to the other end of the current path of the first MOS transistor, a third MOS transistor of the second conductivity type having a current path connected between the other end of the current path of the second MOS transistor and a second voltage supply source, a first inverter having an input node connected to a connection point between the first and second current paths, a second inverter having an input node connected to an output node of the first inverter and an output node connected to gates of the first and third MOS transistors, a buffer circuit having an input node connected to the output node of the second inverter, and circuit blocks each including a precharge dynamic gate and having an input terminal, a precharge input terminal, and an output terminal, the input terminals of the circuit blocks being sequentially cascade-connected to the output terminals of next-stage circuit blocks, an input terminal of a first-stage circuit block being connected to an output node of the buffer circuit, an output terminal of a final-stage circuit block being connected to a gate of the second MOS transistor, and the precharge input terminals of the circuit blocks being connected to the output node of the second inverter, wherein an oscillation signal is output from the output terminal of a selected circuit block.

With this arrangement, since oscillation starts after precharge (initial setting) of each precharge dynamic gate, high-order odd-number-fold oscillation can be prevented without any external control, and a stable oscillation mode can be obtained. In addition, a clock having an arbitrary duty ratio can be obtained even with a relatively simple circuit arrangement by selecting a circuit block for outputting an oscillation signal.

The first object of the present invention can be achieved by a ring oscillator comprising a first MOS transistor of a first conductivity type having one end of a current path connected to a first voltage supply source, a second MOS transistor of a second conductivity type having one end of a current path connected to the other end of the current path of the first MOS transistor, a third MOS transistor of the second conductivity type having a current path connected between the other end of the current path of the second MOS transistor and a second voltage supply source, a first inverter having an input node connected to a connection point between the first and second current paths, a second inverter having an input node connected to an output node of the first inverter and an output node connected to gates of the first and third MOS transistors, a third inverter having an input node connected to the output node of the second inverter, a buffer circuit formed by sequentially cascade-connecting output terminals and input terminals of an odd number of inverters and connecting an input node of a first-stage inverter to an output node of the third inverter, and circuit blocks each including a precharge dynamic gate and having an input terminal, a precharge input terminal, and an output terminal, the input terminals of the circuit blocks being sequentially cascade-connected to the output terminals of next-stage circuit blocks, the input terminal of a first-stage circuit block being connected to an output node of the buffer circuit, the output terminal of a final-stage circuit block being connected to a gate of the second MOS transistor, and the precharge input terminals of the circuit blocks being connected to the third inverter, wherein an oscillation signal is output from the output terminal of a selected circuit block.

With this arrangement, since oscillation starts after precharge (initial setting) of each precharge dynamic gate, high-order odd-number-fold oscillation can be prevented without any external control, and a stable oscillation mode can be obtained. Further, a clock having an arbitrary duty ratio can be obtained even with a relatively simple circuit arrangement by selecting a circuit block for outputting an oscillation signal.

The second object of the present invention can be achieved by a method of measuring a gate delay time of a ring oscillator formed by connecting a plurality of gate circuits each including a precharge dynamic gate in a ring shape, comprising the steps of measuring an oscillation frequency of the ring oscillator, and dividing a reciprocal of the oscillation frequency by the number of precharge dynamic gates constituting the ring oscillator.

By this measuring method, when the precharge period is short, the delay time per dynamic gate can be easily obtained.

The second object of the present invention can be achieved by a method of measuring a gate delay time of a ring oscillator formed by connecting a plurality of gate circuits each including a precharge dynamic gate in a ring shape, comprising the steps of measuring an oscillation frequency of a first ring oscillator formed by connecting a plurality of gate circuits each including a precharge dynamic gate in a ring shape, measuring an oscillation frequency of a second ring oscillator which is formed by connecting, in a ring shape, a different number of gate circuits each including a precharge dynamic gate from the first ring oscillator, and requires the same time for precharge as the first ring oscillator, and calculating a gate delay time of the precharge dynamic gate on the basis of the oscillation frequencies of the first and second ring oscillators.

By this method, when the precharge period is long to a non-negligible degree, the precharge time can be canceled, and the delay time per dynamic gate can be relatively easily obtained with high precision.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 11 is a circuit diagram showing an example of a ring oscillator used to measure the delay time of the dynamic gate.

DETAILED DESCRIPTION OF THE INVENTION

Figure 3:
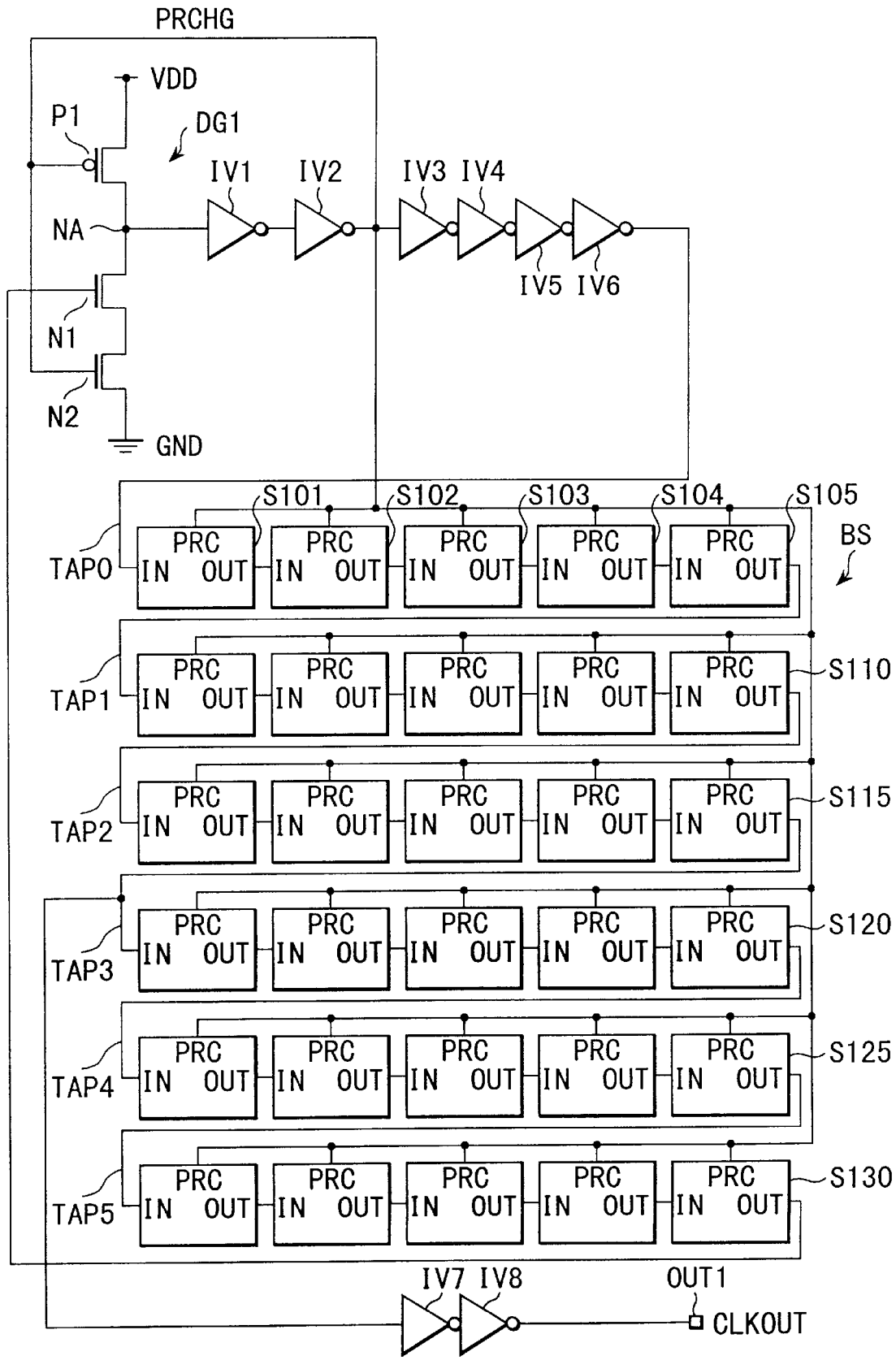
FIG. 3 is a circuit diagram showing the arrangement of a ring oscillator according to the first embodiment of the present invention.

FIG. 3 is a circuit diagram showing the arrangement of a ring oscillator according to the first embodiment of the present invention. This ring oscillator comprises a p-channel MOS transistor (to be referred to as a pMOS transistor hereinafter) P1, n-channel MOS transistors (to be referred to as nMOS transistors hereinafter) N1 and N2, inverters IV1 to IV8, and circuit blocks S101 to S130.

The source of the pMOS transistor P1 is connected to a power supply voltage $V_{DD}$, and the drain is connected to the drain of the nMOS transistor N1. The source of the nMOS transistor N1 is connected to the drain of the nMOS transistor N2. The source of the nMOS transistor N2 is connected to a reference voltage source (ground point GND).

The six inverters IV1 to IV6 are cascade-connected to a connection point NA between the drain of the pMOS transistor P1 and the drain of the nMOS transistor N1. The output node of the final-stage inverter IV6 is connected to an input terminal IN of the first-stage circuit block S101 in a circuit block group BS. FIG. 3 shows an example in which the 30 circuit blocks S101 to S130 are cascade-connected. That is, an output terminal OUT of the circuit block S101 is connected to the input terminal IN of the next-stage circuit block S102, and the output terminal OUT of the circuit block S102 is connected to the input terminal IN of the third circuit block S103. In this way, the circuit blocks S101 to S130 are cascade-connected by sequentially connecting the output terminals OUT to the next input terminals IN. The output terminal OUT of the final-stage circuit block S130 is connected to the gate of the nMOS transistor N1. Note that all the circuit blocks S101 to S130 have the same circuit arrangement, and a detailed arrangement will be described later.

The output node of the inverter IV2 is connected to the gates of the pMOS and nMOS transistors P1 and N1 and to precharge input terminals PRC of the circuit blocks S101 to S130. The output terminal OUT of the circuit block S115 is connected to the input node of the inverter IV7, and the output node of the inverter IV7 is connected to the input node of the inverter IV8. The output node of the inverter IV8 is connected to an output terminal OUT1 for outputting an oscillation output (clock) CLKOUT.

In FIG. 3, TAP0 represents an output signal from the inverter IV6, TAP1 represents an output signal from the circuit block S105, TAP2 represents an output signal from the circuit block S110, TAP3 represents an output signal from the circuit block S115, TAP4 represents an output signal from the circuit block S120, and TAP5 represents an output signal from the circuit block S125.

The circuit arrangement of each of the circuit blocks S101 to S130 in the circuit shown in FIG. 3 will be explained. Each circuit block is generally called a domino circuit, includes a high-precharge dynamic gate, and has an arrangement shown in FIG. 4. More specifically, each circuit block is basically constituted by a pMOS transistor P11, nMOS transistors N11 and N12, and an inverter IV11, similarly to the circuit portion constituted by the MOS transistors P1, N1, and N2 and the inverter IV1 in the circuit shown in FIG. 3. The source of the pMOS transistor P11 is connected to the power supply voltage $V_{DD}$, and the drain is connected to the drain of the nMOS transistor N11. The source of the nMOS transistor N11 is connected to the drain of the nMOS transistor N12. The source of the nMOS transistor N12 is connected to the reference voltage source (ground point GND). The input node of the inverter IV11 is connected to a connection point NB between the drain of the pMOS transistor P11 and the drain of the nMOS transistor N11. The gate of the nMOS transistor N11 is connected to the input terminal IN, the output node of the inverter IV11 is connected to the output terminal OUT, and the gates of the pMOS and nMOS transistors P11 and N12 are connected to the precharge input terminal PRC.

The operation of the-ring oscillator having the above arrangement will be described. FIG. 5 is a timing chart for explaining the operation of the ring oscillator shown in FIGS. 3 and 4. When the power supply is turned on, a pulse signal for precharge (precharge pulse PRCHG) is generated by one dynamic gate DG1 made up of the pMOS transistor P1 and the nMOS transistors N1 and N2 and two static gates made up of the inverters IV1 and IV2 in the circuit shown in FIG. 3.

Figure 1:
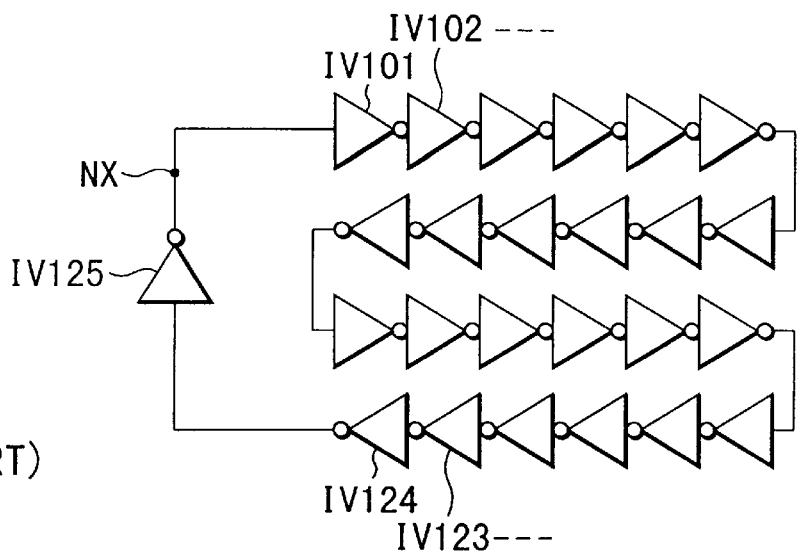
FIG. 1 is a circuit diagram showing an example of the arrangement of a conventional ring oscillator.
Figure 2:
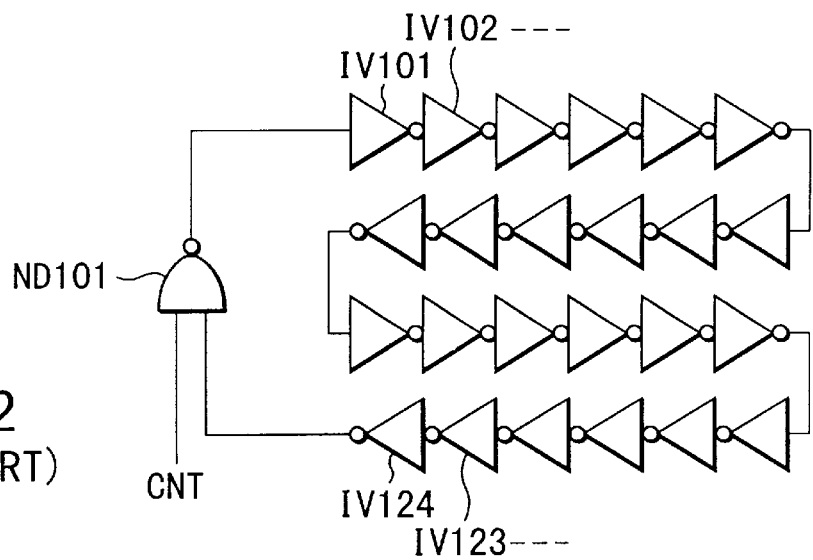
FIG. 2 is a circuit diagram showing another example of the arrangement of the conventional ring oscillator.
Figure 4:
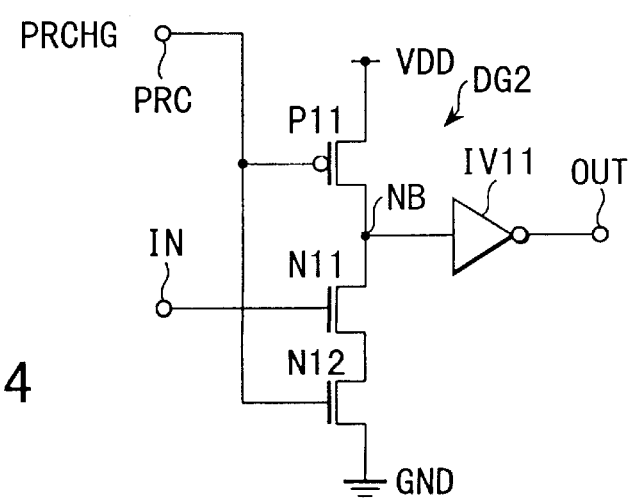
FIG. 4 is a circuit diagram showing an example of the arrangement of a dynamic gate in the ring oscillator shown in FIG. 3.
Figure 5:
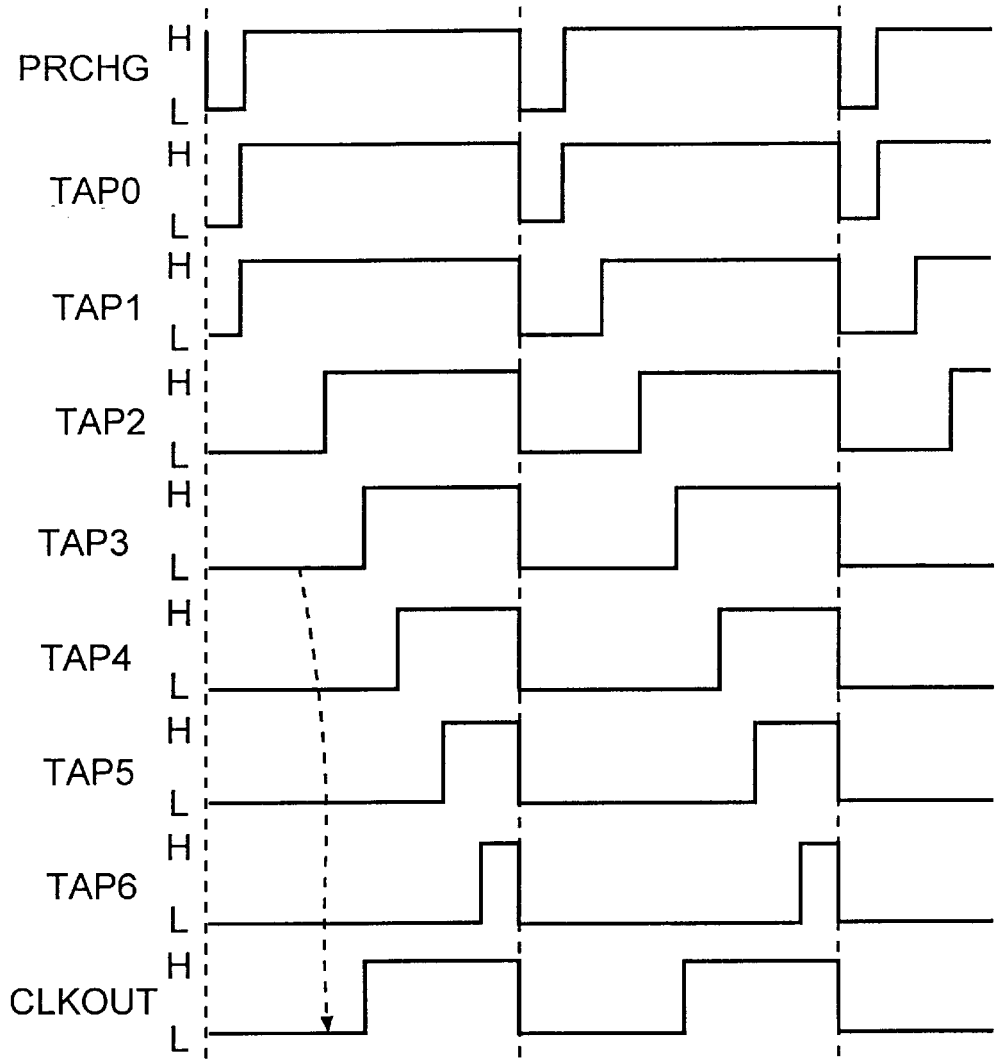
FIG. 5 is a timing chart for explaining the operation of the ring oscillator shown in FIGS. 3 and 4.

During the precharge period in which the precharge pulse PRCHG is at "L" level, the pMOS transistor P1 and the respective pMOS transistors P11 in the circuit blocks S101 to S130 are turned on to simultaneously precharge all the dynamic gates, i.e., the dynamic gate DG1 and dynamic gates DG2 of the circuit blocks S101 to S130 in FIG. 4.

When the dynamic node NA (connection point NA) changes to "H" level upon this precharge, the precharge pulse PRCHG changes to "H" level, the pMOS transistor P1 and the pMOS transistors P11 in the circuit blocks S101 to S130 are turned off, and the nMOS transistor N2 and the nMOS transistors N12 in the circuit blocks S101 to S130 are turned on. The precharge of the dynamic gate DG1 and all the dynamic gates DG2 of the circuit blocks S101 to S130 in FIG. 3 completes. At this time, the dynamic nodes NB (connection points NB) in the circuit blocks S101 to S130 also change to "H" level and maintain the "H" level.

When the precharge pulse PRCHG changes to "H" level, the output signal TAP0 from the inverter IV6 changes to "H" level, and this "H"-level signal is input as an input signal to the input terminal IN of the first-stage circuit block S101 to turn on the nMOS transistor N11. Since the nMOS transistor N12 is kept on by the "H"-level precharge pulse PRCHG, as described above, the dynamic gate DG2 of the precharged circuit block S101 is discharged to "L" level, the dynamic node NB changes to "L" level, and this "L"-level signal is input to the inverter IV11. The inverter IV11 inputs the "H"-level signal to the input terminal IN of the second circuit block S102 via the output terminal OUT of the circuit block S101.

After the "H"-level signal is input to the input terminal IN of the second circuit block S102, the nMOS transistor N11 of the circuit block S102 is turned on. Since the nMOS transistor N12 is kept on by the "H"-level precharge pulse PRCHG, as described above, the dynamic gate DG2 of the precharged circuit block S102 is discharged to "L" level, the dynamic node NB changes to "L" level, and this "L"-level signal is input to the inverter IV11. The inverter IV11 inputs the "H"-level signal to the input terminal IN of the third circuit block S103 via the output terminal OUT of the circuit block S102.

The same operation is repeatedly executed from the third circuit block S103 to the final-stage circuit block S130 to output an "H"-level signal from the output terminal OUT of the circuit block S130. In other words, an "H"-level input signal sequentially propagates through the first-stage circuit block S101 to the final-stage circuit block S130.

When the "H"-level signal output from the output terminal OUT of the final-stage circuit block S130 is input to the gate of the nMOS transistor N1, the nMOS transistor N1 is turned on. Since the nMOS transistor N2 is kept on by the "H"-level precharge pulse PRCHG, as described above, the precharged dynamic gate DG1 is discharged to "L" level. Then, the dynamic node NA changes to "L" level, and the "L"-level signal is input to the inverter IV1.

The "L"-level precharge pulse PRCHG obtained upon inversion by the inverter IV1 and inversion by the inverter IV2 is input to the gate of the pMOS transistor P1 and the gate of the nMOS transistor N2. The "L"-level signal output from the inverter IV2 is input to the gates of the pMOS transistors P11 and the gates of the nMOS transistors N12 through the precharge input terminals PRC of the circuit blocks S101 to S130. The pMOS transistor P1 and the respective pMOS transistors P11 in the circuit blocks S101 to S130 are turned on, and the nMOS transistor N2 and the nMOS transistors N12 in the circuit blocks S101 to S130 are turned off to simultaneously precharge all the dynamic gates, i.e., the dynamic gate DG1 and the dynamic gates DG2 of the circuit blocks S101 to S130 in FIG. 3 again.

Assuming that this precharge period is short, if the signal TAP3 output from the output terminal OUT of the circuit block S115 is output from the output terminal OUT1 via the cascade-connected inverters IV7 and IV8 in the example shown in FIG. 3, an oscillation output (clock) CLKOUT having a duty ratio of about 50% can be obtained. Alternatively, any one of the signals TAP0 to TAP2 and TAP4 to TAP6 shown in FIG. 5 may be output via the inverters IV7 and IV8. A clock having a desired duty ratio can be obtained by extracting an output from an arbitrary circuit block. In this manner, the oscillation output can be obtained from this ring oscillator.

Figure 6:
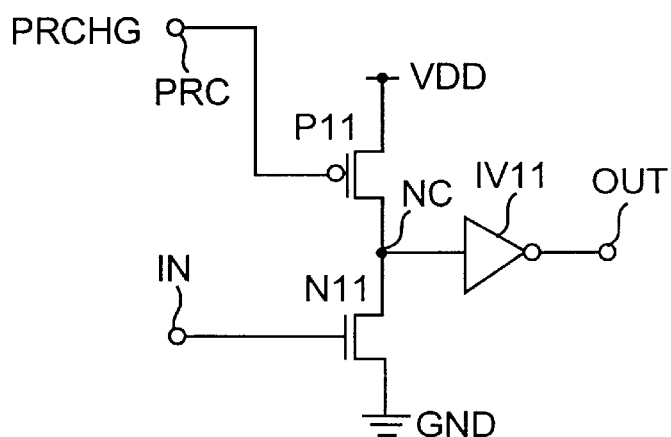
FIG. 6 is a circuit diagram showing a modification of the dynamic gate shown in FIG. 4.

As each of the circuit blocks S101 to S130, a circuit shown in FIG. 6 may be employed. This circuit is constituted by omitting the nMOS transistor N12 from the circuit shown in FIG. 4 and has the following arrangement. The source of the pMOS transistor P11 is connected to the power supply voltage $V_{DD}$, and the drain is connected to the drain of the nMOS transistor N11. The source of the nMOS transistor N11 is connected to the reference voltage source (GND). The gate of the pMOS transistor P11 is connected to the precharge input terminal PRC, and the gate of the nMOS transistor N11 is connected to the input terminal IN. The input node of the inverter IV11 is connected to a connection point NC between the drain of the pMOS transistor P11 and the drain of the nMOS transistor N11, and the output node of the inverter IV11 is connected to the output terminal OUT.

Even if the circuit having the arrangement shown in FIG. 6 replaces each of the circuit blocks S101 to S130 in the circuit shown in FIG. 3, the ring oscillator operates substantially similarly to the oscillator having the circuit arrangement shown in FIG. 4, and the same operational effect can be obtained.

As described above, the ring oscillator according to the first embodiment and its modification of the present invention is mainly constituted by the dynamic gates DG1 and DG2, and starts oscillation upon precharge (initial setting) of the precharge dynamic gate without any external control. For this reason, no high-order oscillation mode occurs in principle, and the oscillation mode becomes stable. In addition, a clock having an arbitrary duty ratio can be obtained with a relatively simple circuit arrangement.

Figure 7:
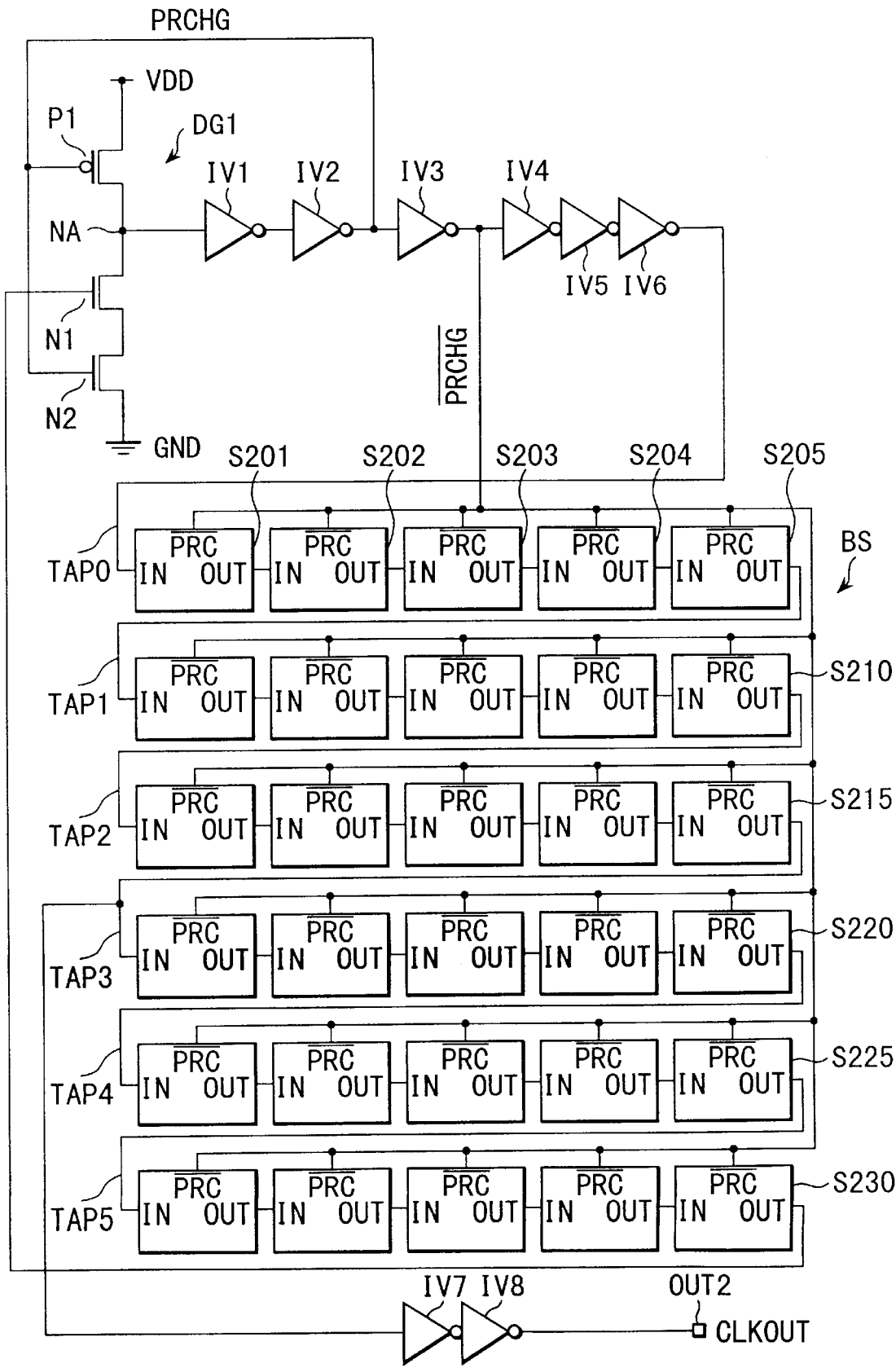
FIG. 7 is a circuit diagram showing the arrangement of a ring oscillator according to the second embodiment of the present invention.

A ring oscillator according to the second embodiment of the present invention will be described. FIG. 7 is a circuit diagram showing the arrangement of the ring oscillator according to the second embodiment of the present invention. In the second embodiment, a signal $\overline{PRCHG}$ prepared by inverting the precharge pulse PRCHG is used instead of the precharge pulse PRCHG in the first embodiment in order to precharge a plurality of connected circuit blocks. This enables the use of a low-precharge dynamic gate in place of a high-precharge dynamic gate employed in the first embodiment.

Similar to the first embodiment, this ring oscillator comprises a pMOS transistor P1, nMOS transistors N1 and N2, inverters IV1 to IV8, and circuit blocks S201 to S230. The source of the pMOS transistor P1 is connected to a power supply voltage $V_{DD}$, and the drain is connected to the drain of the nMOS transistor N1. The source of the nMOS transistor N1 is connected to the drain of the nMOS transistor N2. The source of the nMOS transistor N2 is connected to a reference voltage source (ground point GND).

The six inverters IV1 to IV6 are cascade-connected to a connection point NA between the drain of the pMOS transistor P1 and the drain of the nMOS transistor N1. The output node of the final-stage inverter IV6 is connected to an input terminal IN of the first-stage circuit block S201 in a circuit block group BS. FIG. 7 shows an example in which the 30 circuit blocks S201 to S230 are cascade-connected. That is, an output terminal OUT of the circuit block S201 is connected to the input terminal IN of the next-stage circuit block S202, and the output terminal OUT of the circuit block S202 is connected to the input terminal IN of the third circuit block S203. In this way, the circuit blocks S201 to S230 are cascade-connected by sequentially connecting the output terminals OUT to the next input terminals IN. The output terminal OUT of the final-stage circuit block S230 is connected to the gate of the nMOS transistor N1. Note that all the circuit blocks S201 to S230 have the same circuit arrangement, and a detailed arrangement will be described later.

The output node of the inverter IV2 is connected to the gate of the pMOS transistor P1 and the gate of the nMOS transistor N2. The output node of the inverter IV3 is connected to precharge input terminals $\overline{PRC}$ of the respective circuit blocks S201 to S230. The output terminal OUT of the circuit block S215 is connected to the input node of the inverter IV7, and the output node of the inverter IV7 is connected to the input node of the inverter IV8. The output node of the inverter IV8 is connected to an output terminal OUT2 for outputting an oscillation output (clock) CLKOUT.

In FIG. 7, TAP0 represents an output signal from the inverter IV6, TAP1 represents an output signal from the circuit block S205, TAP2 represents an output signal from the circuit block S210, TAP3 represents an output signal from the circuit block S215, TAP4 represents an output signal from the circuit block S220, and TAP5 represents an output signal from the circuit block S225.

Figure 8:
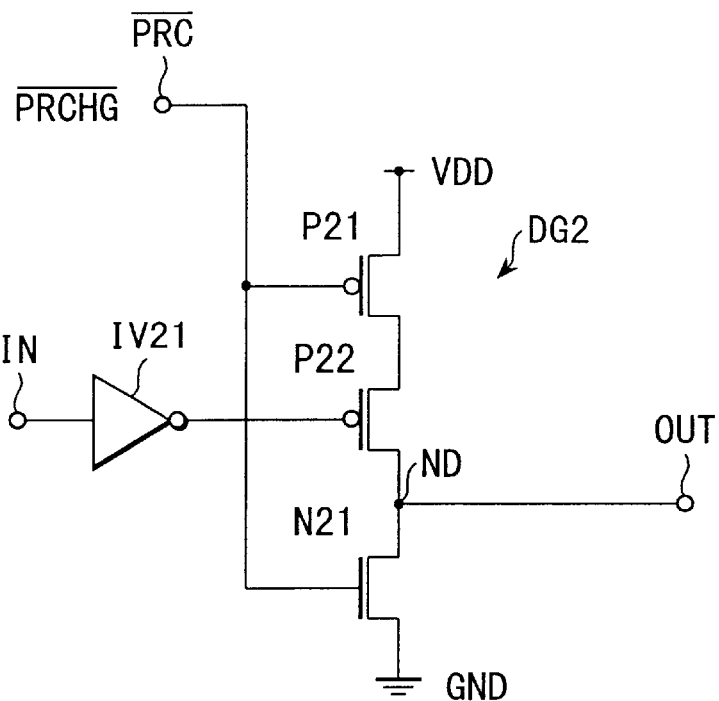
FIG. 8 is a circuit diagram showing an example of the arrangement of a dynamic gate in the ring oscillator shown in FIG. 7.

The circuit arrangement of each of the circuit blocks S201 to S230 in the circuit shown in FIG. 7 will be explained. Each circuit block is generally called a domino circuit, and constituted by pMOS transistors P21 and P22, an nMOS transistor N21, and an inverter IV21, as shown in FIG. 8. The source of the pMOS transistor P21 is connected to the power supply voltage $V_{DD}$, and the drain is connected to the source of the pMOS transistor P22. The drain of the pMOS transistor P22 is connected to the drain of the nMOS transistor N21. The source of the nMOS transistor N21 is connected to the reference voltage source (ground point GND). The gate of the pMOS transistor P21 and the gate of the nMOS transistor N21 are connected to the precharge input terminal $\overline{PRC}$, and the gate of the pMOS transistor P22 is connected to the output node of the inverter IV21. The input node of the inverter IV21 is connected to the input terminal IN. A connection point ND between the drain of the pMOS transistor P22 and the drain of the nMOS transistor N21 is connected to the output terminal OUT.

Figure 9:
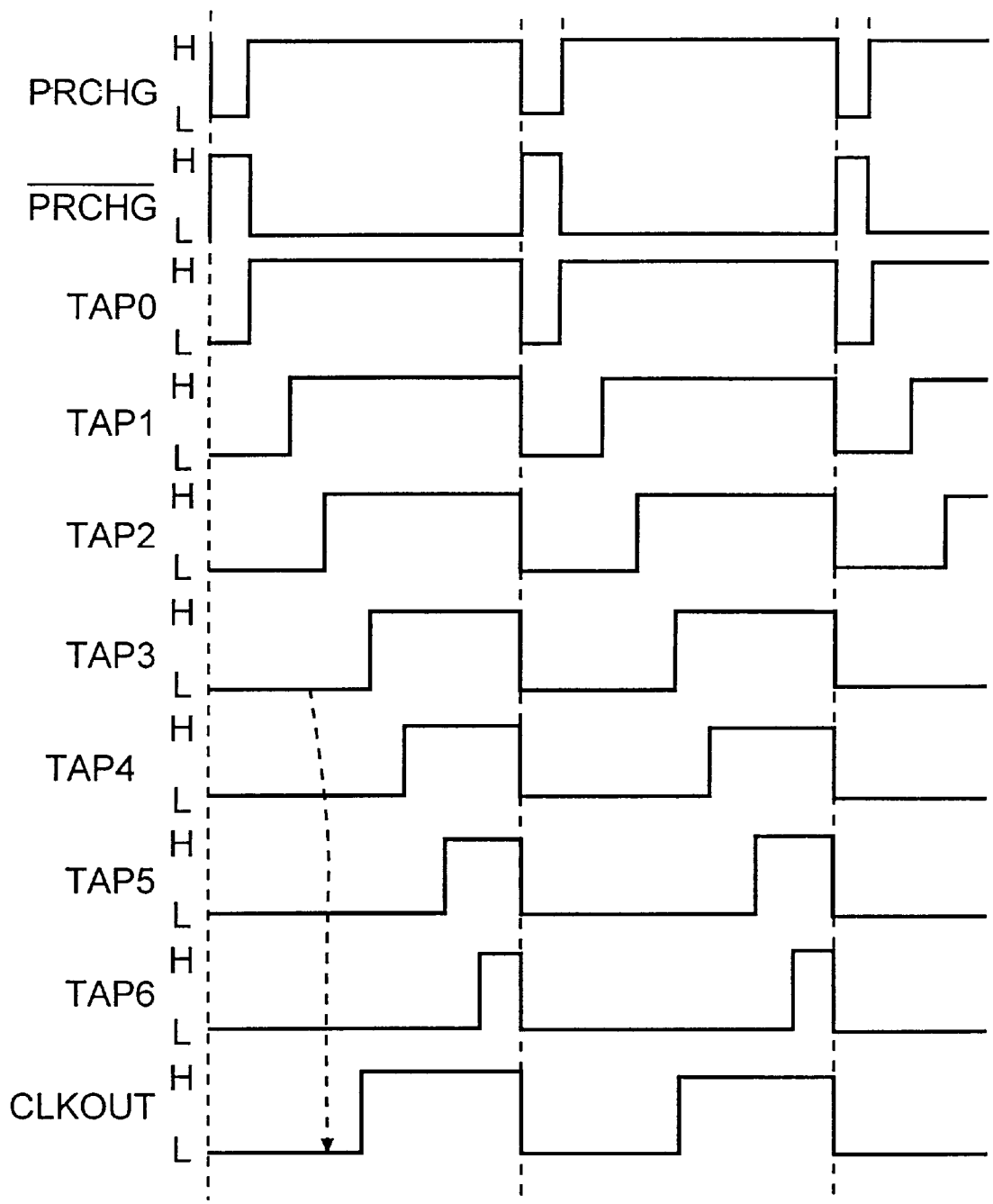
FIG. 9 is a timing chart for explaining the operation of the ring oscillator shown in FIGS. 7 and 8.

The operation of the ring oscillator shown in FIGS. 7 and 8 according to the second embodiment of the present invention will be described. FIG. 9 is a timing chart for explaining the operation of the ring oscillator. A precharge pulse PRCHG is generated by one dynamic gate DG1 made up of the pMOS transistor P1 and the nMOS transistors N1 and N2 and two static gates made up of the inverters IV1 and IV2 in the circuit shown in FIG. 7. This precharge pulse PRCHG is inverted to a precharge pulse $\overline{PRCHG}$ by the inverter IV3.

During the precharge period in which the precharge pulse PRCHG is at "L" level, and the precharge pulse $\overline{PRCHG}$ is at "H" level, the pMOS transistor P1 is turned on to precharge the dynamic gate DG1 in FIG. 7. Also, during the precharge period, the pMOS transistors P21 in the circuit blocks S201 to S230 are turned off, and the nMOS transistors N21 are turned on to precharge dynamic gates DG2 of the circuit blocks S210 to S230 to "L" level.

When the dynamic node NA (connection point NA) changes to "H" level upon this precharge, the precharge pulse PRCHG changes to "H" level, the pMOS transistor P1 is turned off, and the nMOS transistor N2 is turned on. In addition, when the dynamic node NA changes to "H" level, the precharge pulse $\overline{\text{PRCHG}}$ changes to "L" level, the nMOS transistors N21 in the circuit blocks S201 to S230 are turned off, and the pMOS transistors P21 are turned on.

Accordingly, the precharge of the dynamic gate DG1 and the dynamic gates DG2 of the circuit blocks S201 to S230 in FIG. 7 completes. At this time, the dynamic nodes ND (connection points ND) in the circuit blocks S201 to S230 also change to "L" level and maintain the "L" level.

When the precharge pulse PRCHG changes to "H" level, an output from the inverter IV6 changes to "H" level, and this "H"-level signal is input as an input signal to the input terminal IN of the first-stage circuit block S201. This input signal changes to "L" level through the inverter IV21 in the circuit block S203, and the "L"-level signal is input to the gate of the pMOS transistor P22 to turn on the pMOS transistor P22. Since the pMOS transistor P21 is kept on by the "L"-level precharge pulse $\overline{\text{PRCHG}}$, as described above, the dynamic gate DG2 of the circuit block S201 precharged to "L" level is charged to "H" level, the dynamic node ND changes to "H" level. This "H"-level signal is input to the input terminal IN of the second circuit block S202 via the output terminal OUT of the circuit block S201.

After the "H"-level signal is input to the input terminal IN of the second circuit block S202, this signal changes to "L" level via the inverter IV21, the "L"-level signal is input to the gate of the pMOS transistor P22 to turn on the pMOS transistor P22. Since the pMOS transistor P21 is kept on by the "L"-level precharge pulse $\overline{\text{PRCHG}}$, as described above, the dynamic gate DG2 of the circuit block S202 precharged to "L" level is charged to "H" level, and the dynamic node NB changes to "H" level. This "H"-level signal is input to the input terminal IN of the third circuit block S203 via the output terminal OUT of the circuit block S202.

The same operation is repeatedly executed from the third circuit block S203 to the final-stage circuit block S230 to output an "H"-level signal from the output terminal OUT of the circuit block S230. In other words, an "H"-level input signal sequentially propagates through the first-stage circuit block S201 to the final-stage circuit block S230.

When the "H"-level signal output from the output terminal OUT of the final-stage circuit block S230 is input to the gate of the nMOS transistor N1, the nMOS transistor N1 is turned on. Since the nMOS transistor N2 is kept on by the "H"-level precharge pulse PRCHG, as described above, the precharged dynamic gate DG1 is discharged to "L" level. Then, the dynamic node NA changes to "L" level, and the "L"-level signal is input to the inverter IV1.

The input "L"-level signal is inverted by the inverter IV1 and further by the inverter IV2. The "L"-level precharge pulse PRCHG is input to the gate of the pMOS transistor P1 and the gate of the nMOS transistor N2. The "H"-level signal output from the inverter IV3 is input to the gates of the nMOS transistors N21 and the gates of the pMOS transistors P21 in the circuit blocks S201 to S230 through the precharge input terminals $\overline{\text{PRC}}$ of the circuit blocks S201 to S230.

The pMOS transistor P1 is turned on, and the nMOS transistor N2 is turned off to precharge the dynamic gate DG1 in FIG. 7 again. By the "H"-level output from the inverter IV3, the pMOS transistors P21 in the circuit blocks S201 to S230 are turned off, and the nMOS transistors N21 are turned on to precharge the dynamic gates DG2 of the circuit blocks S201 to S230 to "L" level again. That is, the dynamic gate DG1 and the dynamic gates DG2 of the circuit blocks S201 to S230 in FIG. 7 are simultaneously precharged.

Assuming that the precharge period is short, if the output TAP3 from the output terminal OUT of the circuit block S215 is output from the output terminal OUT2 via the cascade-connected inverters IV7 and IV8 in the example shown in FIG. 7, an oscillation output (clock) CLKOUT having a duty ratio of about 50% can be obtained. Alternatively, any one of the signals TAP0 to TAP2 and TAP4 to TAP6 shown in FIG. 9 may be output via the inverters IV7 and IV8. A clock having a desired duty ratio can be obtained by extracting an output from an arbitrary circuit block.

Figure 10:
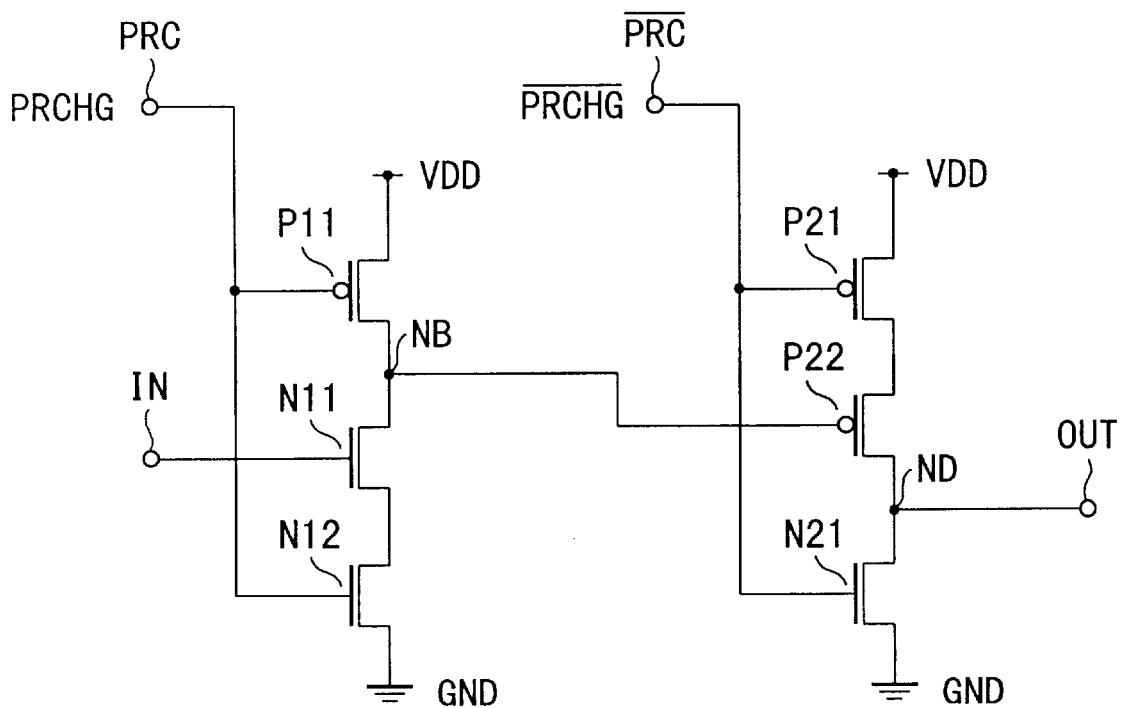
FIG. 10 is a circuit diagram showing a modification of the dynamic gate shown in FIG. 8.

As a modification of the second embodiment, a circuit shown in FIG. 10 as a combination of the circuits shown in FIGS. 4 and 8 may be employed as each of the circuit blocks S201 to S230. This circuit is a dynamic gate of both high- and low-precharge types, and comprises the pMOS transistors P11, P21, and P22 and the nMOS transistors N11, N12, and N21. That is, the source of the pMOS transistor P11 is connected to the power supply voltage $V_{DD}$, and the drain is connected to the drain of the nMOS transistor N11. The source of the nMOS transistor N11 is connected to the drain of the nMOS transistor N12. The source of the nMOS transistor N12 is connected to the reference voltage source (ground point GND). The connection point NB between the drain of the pMOS transistor P11 and the drain of the nMOS transistor N11 is connected to the gate of the pMOS transistor P22. The gates of the pMOS and nMOS transistors P11 and N12 are connected to the precharge input terminal PRC, and the gate of the nMOS transistor N11 is connected to the input terminal IN.

The source of the pMOS transistor P21 is connected to the power supply voltage $V_{DD}$, and the drain is connected to the source of the pMOS transistor P22. The drain of the pMOS transistor P22 is connected to the drain of the nMOS transistor N21. The source of the nMOS transistor N21 is connected to the reference voltage source (GND). The gates of the pMOS and nMOS transistors P21 and N21 are connected to the precharge input terminal $\overline{\text{PRC}}$, and the connection point ND between the drain of the pMOS transistor P22 and the drain of the nMOS transistor N21 is connected to the output terminal OUT.

The precharge pulse PRCHG is input to the precharge input terminal PRC, and the precharge pulse $\overline{\text{PRCHG}}$ is input to the precharge input terminal $\overline{\text{PRC}}$. The remaining arrangement is the same as in the second embodiment.

The ring oscillator obtained by replacing each of the circuit blocks S201 to S230 in the circuit shown in FIG. 7 with the circuit block shown in FIG. 10 operates similarly to the second embodiment. Any one of the signals TAP0 to TAP2 and TAP4 to TAP6 shown in FIG. 9 may be output via the inverters IV7 and IV8. A clock having a desired duty ratio can be obtained by extracting an output from an arbitrary circuit block.

As described above, the ring oscillator according to the second embodiment and its modification is constituted by the dynamic gates DG1 and DG2. The ring oscillator does not require any external control, no high-order oscillation mode occurs in principle, and thus the oscillation mode becomes stable. Moreover, an oscillation output (clock) having an arbitrary duty ratio can be obtained with a relatively simple circuit arrangement.

A method of measuring the delay time per dynamic gate in the ring oscillator of the first embodiment will be explained.

In the precharge circuit constituted by the circuit blocks S101 to S130, when the precharge time is short, the delay time per dynamic gate can be easily calculated by measuring the oscillation frequency of the ring oscillator of the first embodiment shown in FIG. 3 and dividing the reciprocal of the oscillation frequency by the number of dynamic gates, i.e., 30 as the number of circuit blocks S101 to S130.

When, however, the precharge period is relatively long to a non-negligible degree, the precharge time must be canceled, and the delay time cannot be calculated by the above method. For this reason, another ring oscillator in which the precharge circuit (circuit block group BS) is constituted by a different number of dynamic gates from that in the first embodiment, and a dummy capacitor is connected to make the precharge time equal is prepared.

FIG. 11 is a circuit diagram showing an example of the arrangement of this ring oscillator. In this ring oscillator, the number of circuit blocks S101 to S130 in the first embodiment is decreased to 20 circuit blocks S101 to S120, and dummy capacitors F101 to F110 are connected to make the precharge time equal. The remaining arrangement is the same as in the first embodiment. Therefore, in the ring oscillator shown in FIG. 11, compared to the ring oscillator of the first embodiment shown in FIG. 3, the number of dynamic gates is 2/3, the load of the precharge signal line is the same, and the precharge time is the same.

The delay time per dynamic gate is calculated, while the precharge time is canceled by the oscillation frequencies and the numbers of dynamic gates in the ring oscillator of the first embodiment and the ring oscillator having the dummy capacitors. Letting m be the number of dynamic gates in the ring oscillator of the first embodiment, n be the number of dynamic gates in the ring oscillator shown in FIG. 11, fa and fb be their oscillation frequencies, tpre be the precharge time, and tpd be the delay time per dynamic gate, $$1/fa = tpre + tpd \times m$$

$$1/fb = tpre + tpd \times n$$

Then, the gate delay time tpd is $$tpd = (1/fa - 1/fb)/(m-n)$$

Since m=30 and n=20 in the ring oscillator of the first embodiment and the ring oscillator shown in FIG. 11, $$tpd = (1/fa - 1/fb)/10$$

The delay time per dynamic gate can be relatively easily calculated with high precision.

As for the ring oscillator of the second embodiment and a ring oscillator in which the precharge circuit is constituted by other dynamic gates, the delay time per dynamic gate can also be calculated by the same method.

As described above, according to the method of measuring the gate delay time, the delay time of the dynamic gate can be easily measured with high precision by measuring the oscillation frequency of the ring oscillator constituted by dynamic gates. Further, the delay time of the dynamic gate can be monitored in addition to the delay time of the static gate by mounting the ring oscillator of each embodiment on a semiconductor integrated circuit (LSI) chip.

More specifically, according to the present invention, a ring oscillator constituted by dynamic gates without any external control can be realized by using each of precharge dynamic gates as a constituent unit and using an output from one of the dynamic gates as a precharge pulse. In addition, the delay time per dynamic gate can be easily measured from the oscillation frequency.

As has been described above, according to the present invention, there can be provided a ring oscillator which is constituted by dynamic gates such as domino circuits and can prevent high-order odd-number-fold oscillation without any external control, and a gate delay time measuring method of easily obtaining the delay time of the dynamic gate using this ring oscillator.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ring oscillator comprising:
at least three odd gate circuits connected in a ring shape, at least one of said gate circuits including a precharge dynamic gate, wherein the precharge dynamic gate comprises a first MOS transistor of a first conductivity type having one end of a current path connected to a first voltage supply source and a gate connected to an output terminal of an even-numbered gate circuit, a second MOS transistor of a second conductivity type having one end of a current path connected to the other end of the current path of said first MOS transistor and a gate connected to an output terminal of a final-stage gate circuit, and a third MOS transistor of the second conductivity type having a current path connected between the other end of the current path of said second MOS transistor and a second voltage supply source and a gate connected to the output terminal of the even-numbered gate circuit.

2. A ring oscillator comprising:
at least three odd gate circuits connected in a ring shape, each gate circuit including a precharge dynamic gate, wherein an output from the precharge dynamic gate in one gate circuit is used to precharge the precharge dynamic gate of another gate circuit.

3. The ring oscillator according to claim 2, wherein each gate circuit comprises an input terminal, a precharge input terminal, and an output terminal, the output terminal of said gate circuit is connected to the input terminal of a next-stage gate circuit, and the output terminal of a final-stage gate circuit is connected to the input terminal of a first-stage gate circuit, and an output from the first-stage gate circuit is supplied to the input terminal of a second-stage gate circuit and to the precharge input terminals of the precharge dynamic gates of all the gate circuits.

4. The ring oscillator according to claim 3, further comprising a precharge time adjusting element arranged on a signal line for precharging each precharge dynamic gate.

5. The ring oscillator according to claim 2, wherein the precharge dynamic gate is a high-precharge dynamic gate.

6. The ring oscillator according to claim 5, wherein the precharge dynamic gate comprises a first MOS transistor of a first conductivity type having one end of a current path connected to a first voltage supply source and a gate connected to a precharge input terminal, a second MOS transistor of a second conductivity type having one end of a current path connected to the other end of the current path of said first MOS transistor and a gate connected to an input terminal, and a third MOS transistor of the second conductivity type having a current path connected between the other end of the current path of said second MOS transistor and a second voltage supply source and a gate connected to the precharge input terminal.

7. The ring oscillator according to claim 6, wherein said oscillator further comprises an inverter having an input node connected to a connection point between the current paths of said first and second MOS transistors, and an output node connected to an output terminal, and the inverter and the precharge dynamic gate constitute one gate circuit.

8. The ring oscillator according to claim 5, wherein the precharge dynamic gate comprises a first MOS transistor of a first conductivity type having one end of a current path connected to a first voltage supply source and a gate connected to a precharge input terminal, and a second MOS transistor of a second conductivity type having a current path connected between the other end of the current path of said first MOS transistor and a second voltage supply source and a gate connected to an input terminal.

9. The ring oscillator according to claim 8, wherein sail oscillator further comprises an inverter having an input node connected to a connection point between the current paths of said first and second MOS transistors, and an output node connected to an output terminal, and the inverter and the precharge dynamic gate constitute one gate circuit.

10. The ring oscillator according to claim 2, wherein the precharge dynamic gate is a low-precharge dynamic gate.

11. The ring oscillator according to claim 10, wherein the precharge dynamic gate comprises a first MOS transistor of a first conductivity type having one end of a current path connected to a first voltage supply source and a gate connected to a precharge input terminal, a second MOS transistor of the first conductivity type having one end of a current path connected to the other end of the current path of said first MOS transistor and the other end of the current path connected to an output terminal, and a third MOS transistor of a second conductivity type having a current path connected between the output terminal and a second voltage supply source and a gate connected to the precharge input terminal.

12. The ring oscillator according to claim 11, wherein said oscillator further comprises an inverter having an input node connected to an input terminal and an output node connected to a gate of said second MOS transistor, and the inverter and the precharge dynamic gate constitute one gate circuit.

13. The ring oscillator according to claim 2, wherein the precharge dynamic gate is a dynamic gate of both high- and low-precharge types.

14. The ring oscillator according to claim 13, wherein the precharge dynamic gate comprises a first MOS transistor of a first conductivity type having one end of a current path connected to a first voltage supply source and a gate connected to a first precharge input terminal, a second MOS transistor of a second conductivity type having one end of a current path connected to the other end of the current path of said first MOS transistor and a gate connected to an input terminal, a third MOS transistor of the second conductivity type having a current path connected between the other end of the current path of said second MOS transistor and a second voltage supply source and a gate connected to the first precharge input terminal, a fourth MOS transistor of the first conductivity type having one end of a current path connected to the first voltage supply source and a gate connected to a second precharge input terminal for receiving an inverted signal of a precharge signal input to the first precharge input terminal, a fifth MOS transistor of the first conductivity type having a current path connected between the other end of the current path of said fourth MOS transistor and an output terminal and a gate connected to a connection point between the current paths of said first and second MOS transistors, and a sixth MOS transistor of the second conductivity type having a current path connected between the output terminal and the second voltage supply source and a gate connected to the second precharge input terminal.

15. A ring oscillator comprising:
 a first MOS transistor of a first conductivity type having one end of a current path connected to a first voltage supply source;
 a second MOS transistor of a second conductivity type having one end of a current path connected to the other end of the current path of said first MOS transistor;
 a third MOS transistor of the second conductivity type having a current path connected between the other end of the current path of said second MOS transistor and a second voltage supply source;
 a first inverter having an input node connected to a connection point between the first and second current paths;
 a second inverter having an input node connected to an output node of said first inverter and an output node connected to gates of said first and third MOS transistors;
 a buffer circuit having an input node connected to the output node of said second inverter; and
 circuit blocks each including a precharge dynamic gate and having an input terminal, a precharge input terminal, and an output terminal, the input terminals of said circuit blocks being sequentially cascade-connected to the output terminals of next-stage circuit blocks, an input terminal of a first-stage circuit block being connected to an output node of said buffer circuit, an output terminal of a final-stage circuit block being connected to a gate of said second MOS transistor, and the precharge input terminals of said circuit blocks being connected to the output node of said second inverter,
 wherein an oscillation signal is output from the output terminal of a selected circuit block.

16. The ring oscillator according to claim 15, wherein said buffer circuit comprises an even number of inverters having output nodes and input nodes sequentially cascade-connected.

17. The ring oscillator according to claim 15, further comprising at least one inverter having an input node connected to the output terminal of said selected circuit block.

18. The ring oscillator according to claim 15, wherein each circuit block comprises a fourth MOS transistor of the first conductivity type having one end of a current path connected to the first voltage supply source and a gate connected to the precharge input terminal, a fifth MOS transistor of the second conductivity type having one end of a current path connected to the other end of the current path of said fourth MOS transistor and a gate connected to the input terminal, a sixth MOS transistor of the second conductivity type having a current path connected between the other end of the current path of said fifth MOS transistor and the second voltage supply source and a gate connected to the precharge input terminal, and a third inverter having an input node connected to a connection point between the current paths of said fourth and fifth MOS transistors, and an output node connected to the output terminal.

19. The ring oscillator according to claim 15, wherein each circuit block comprises a fourth MOS transistor of the first conductivity type having one end of a current path connected to the first voltage supply source and a gate connected to the precharge input terminal, a fifth MOS transistor of the second conductivity type having a current path connected between the other end of the current path of said fourth MOS transistor and the second voltage supply source and a gate connected to the input terminal, and a third inverter having an input node connected to a connection point between the current paths of said fourth and fifth MOS transistors, and an output node connected to the output terminal.

* * * * *

UNITED STATES PATENT AND TRADEMARK OFFICE
CERTIFICATE OF CORRECTION

PATENT NO.    : 6,154,099
DATED         : November 28, 2000
INVENTOR(S)   : Shingo Suzuki et al.

It is certified that error appears in the above-identified patent and that said Letters Patent is hereby corrected as shown below:

Column 13,
Line 27, "sail" should read -- said --.

Signed and Sealed this

Twelfth Day of October, 2004

JON W. DUDAS
*Director of the United States Patent and Trademark Office*

UNITED STATES PATENT AND TRADEMARK OFFICE
CERTIFICATE OF CORRECTION

PATENT NO.   : 6,154,099
DATED        : November 28, 2000
INVENTOR(S)  : Shingo Suzuki et al.

It is certified that error appears in the above-identified patent and that said Letters Patent is hereby corrected as shown below:

<u>Column 12,</u>
Lines 38-39 and 55-56, "final-stage gate circuit" should read -- final-stage circuit block --.
Lines 54-55, "next-stage gate circuit" should read -- next-stage circuit block --.
Line 58, "second-stage gate circuit" should read -- second-stage circuit block --.

Signed and Sealed this

Twenty-eighth Day of February, 2006

JON W. DUDAS
*Director of the United States Patent and Trademark Office*